(12) United States Patent
Nakamura et al.

(10) Patent No.: US 6,222,225 B1
(45) Date of Patent: Apr. 24, 2001

(54) SEMICONDUCTOR DEVICE AND MANUFACTURING METHOD THEREOF

(75) Inventors: Takuya Nakamura, Kanagawa-Ken; Naoki Koido; Hirohisa Iizuka, both of Yokohama; Kazuhito Narita, Yokkaichi; Seiichi Aritome, Yokohama; Fumitaka Arai, Isogo-Ku, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/405,838

(22) Filed: Sep. 27, 1999

(30) Foreign Application Priority Data

Sep. 29, 1998 (JP) .................................. 10-276126
Sep. 6, 1999 (JP) .................................. 11-252181

(51) Int. Cl.7 .................................................. H01L 29/788
(52) U.S. Cl. ........................ 257/315; 257/374; 257/506; 257/510
(58) Field of Search ..................................... 438/296, 297, 438/424, 425; 257/239, 261, 230, 374, 501, 506, 510, 514, 521, 315, 321

(56) References Cited

U.S. PATENT DOCUMENTS 5,858,830 * 1/1999 Yoo et al. ............................. 438/241
6,034,393 * 3/2000 Sakamoto et al. .................... 257/315
6,069,055 * 5/2000 Ukeda et al. ......................... 438/424

* cited by examiner

Primary Examiner—Olik Chaudhuri
Assistant Examiner—Hoai Pham
(74) Attorney, Agent, or Firm—Banner & Witcoff, Ltd.

(57) ABSTRACT

A semiconductor device has a semiconductor substrate, an element isolation insulation film embedded in a trench formed in said semiconductor substrate in a state of protruding from a surface of said semiconductor substrate and a transistor having a gate electrode provided in an area surrounded by said element isolation insulation film on said semiconductor substrate, and containing a gate electrode deposited through a gate insulation film before embedding said element isolation insulation film and an upper edge corner of said element isolation insulation film is selectively recessed. In the thus structured semiconductor device, the upper edge corner of the element isolation insulation film is recessed before the patterning process of the gate electrode, thereby preventing such a situation that a part of the gate electrode remains unetched in the patterning process of the gate electrode.

9 Claims, 13 Drawing Sheets

SEMICONDUCTOR DEVICE AND MANUFACTURING METHOD THEREOF

BACKGROUND OF THE INVENTION

1. Field of the Invention

The present invention relates generally to a semiconductor device and a manufacturing method thereof, and more particularly to a semiconductor device and a manufacturing method thereof which are suitable for a non-volatile memory such as a NAND type EEPROM, etc., in which an element isolation insulation film is embedded after depositing a gate electrode.

2. Description of the Background Art

An STI (Shallow Trench Isolation) technique has hitherto been known as an element isolation technique used for a high-integration memory such as a NAND type EEPROM, etc. The STI technique is that a shallow trench is formed in an element isolation region on a semiconductor substrate, and the shallow trench is filled with an element isolation insulation material.

The followings are specific methods to which the STI technique is applied:

(a) An element isolation insulation film is formed by embedding then a gate insulation layer and a gate electrode are sequentially formed in a device region.

(b) A gate insulation layer and a gate electrode layer are sequentially formed for on the entire substrate, then the gate electrode layer, the gate insulation layer and the substrate are etched to dig a trench, then an insulating material is filled in the trench.

FIG. 1A is a plan view of a memory cell array area of the NAND type EEPROM, showing a state where the element isolation insulation film is embedded by applying the latter method, and FIG. 1B is a sectional view taken along the line A–A' thereof. shown in FIGS. 1A and 1B, before embedding an element isolation insulation film 4, a gate electrode 6 serving as a part of a floating gate electrode and a silicon nitride layer 7 serving as a stopper mask material for a CMP process, are deposited on a silicon substrate 1 through a gate insulation film (tunnel insulation film) 5. The silicon nitride layer 7, the gate electrode 6, the gate insulation film 5 and the substrate 1 are etched by RIE (Reactive Ion Etching) using a resist pattern, thereby forming a trench 3 in an element isolation region. The element isolation insulation film 4 is embedded in the trench 3. A striped device area 2 defined by the element isolation insulation film 4 is thereby provided. The element isolation insulation film 4 is embedded substantially flush with the silicon nitride layer 7, hereafter, the silicon nitride layer 7 is removed, and a control gate electrode is provided by stacking it.

FIG. 2A is a plan view showing a state where a control gate electrode 9 is formed in on pattern, and FIG. 2B is a sectional view taken along the line B–B' thereof. At a stage shown in FIG. 1B, the gate electrode 6 has been isolated, however, the isolation per memory transistor within the striped device area 2 is not yet done. After removing the silicon nitride layer 7, a gate electrode 6b composing a floating gate electrode is deposited together with the gate electrode 6, and a slit is formed in an element isolation region. Thereafter, an inter-layer gate insulting layer 8 is provided thereon, and a control gate electrode 9 is provided. In a process of patterning the control gate electrode 9, simultaneously the gate electrodes 6b,6 are etched, thereby obtaining a floating gate electrode isolated per memory transistor in the device area 2.

According to the conventional manufacturing method, however, as shown in FIG. 2A, etching residuals 10 of the gate electrodes 6, 6b are produced along the boundary of the element isolation trench 3 between the patterned control gate electrodes 9. This is because if the element isolation insulation film 4 is as shown in FIG. 1B embedded in the trench formed by the RIE, the element isolation insulation film 4 takes, when removing the silicon nitride layer 7 thereafter, such a form of protruding in an inverted tapered shape above the gate electrode 6.

Namely, when patterning the control gate electrode 9 and subsequently etching the gate electrodes 6b, 6 in sequence, of the gate electrodes 6b, 6, especially the lower gate electrode 6, of which some areas are shadowed by corners of the element isolation insulation film 4, is not therefore completely etched. These etching residuals 10 might cause a defect such as a floating gate short-circuit of the memory transistor in the NAND type cell.

The same kind of problem might occur in not only the NAND type EEPROM but also other types of transistor circuits using the similar element isolation technique.

SUMMARY OF THE INVENTION

Therefore, it is a primary object of the present invention to provide a semiconductor device and a manufacturing method thereof which are capable of surely preventing a short-circuit between gate electrodes.

According to a first aspect of the present invention, there is provided a semiconductor device comprising a semiconductor substrate; an element isolation insulation film embedded in a trench formed in the semiconductor substrate in a state of protruding from a surface of the semiconductor substrate; and a transistor provided on the semiconductor substrate; wherein said element isolation insulation film embedded in the trench has a recess at an upper edge corner thereof.

According to a second aspect of the present invention, there is provided a semiconductor device comprising a semiconductor substrate; an element isolation insulation film embedded in a trench formed in the semiconductor substrate in a state of protruding from a surface of the semiconductor substrate; and a transistor provided on the semiconductor substrate, said transistor having a gate electrode formed through a gate insulation film before embedding the element isolation insulation film, wherein an upper edge corner of the element isolation insulation film is selectively recessed.

According to a third aspect of the present invention, there is provided a method of manufacturing a semiconductor device, comprising the steps of:

sequentially depositing a gate electrode and a mask layer on a semiconductor substrate through a gate insulation film;

forming a trench in an element isolation region by etching the gate electrode, the gate insulation film and the semiconductor substrate in sequence by anisotropic etching;

filling the element isolation insulation film in the trench substantially flush with the mask layer, with said mask layer remaining left;

removing at least a part of the mask layer in a layer thickness wise direction thereof, and thereafter recessing an upper edge corner of the element isolation insulation film by isotropic etching; and removing the mask layer and thereafter forming a gate electrode by patterning the gate electrode.

According to a fourth aspect of the present invention, there is provided a method of manufacturing a semiconductor device having a memory cell array in which non-volatile memory transistors each including a floating gate electrode and a control gate electrode coupled in capacity thereto are formed in array, the method comprising the steps of:

sequentially depositing a gate electrode and a mask layer on a semiconductor substrate through a gate insulation film;

forming a trench in an element isolation region by etching the gate electrode, the gate insulation film and the semiconductor substrate in sequence by anisotropic etching;

filling the element isolation insulation film in the trench substantially flush with the mask layer, with the mask layer remaining left;

removing at least a part of the mask layer in a layer thickness wise direction thereof, and thereafter recessing an upper edge corner of the element isolation insulation film by isotropic etching;

a step of removing the mask layer, and thereafter depositing a second gate electrode composing a floating gate electrode together with the first gate electrode;

forming a slit for isolating the second gate electrode in the element isolation insulation film;

a step of providing a control gate electrode on the second gate electrode through an inter-layer gate insulation film; and forming the floating gate electrode of each of the memory transistors by patterning the second and first gate electrodes in self-alignment with the control gate electrode.

According to the present invention, the upper edge corner of the element isolation insulation film is recessed before the patterning process of the gate electrode, thereby preventing such a situation that a part of the gate electrode remains unetched in the patterning process of the gate electrode. With this contrivance, there is obtained the semiconductor device exhibiting a high reliability with no defect such as a short-circuit of the gate electrode.

BRIEF DESCRIPTION OF THE DRAWINGS

In the accompanying drawings,

FIG. 1B is a sectional view taken along the line A–A' in FIG. 1A;

FIG. 2B is a sectional view taken along the line B–B' in FIG. 2A;

DESCRIPTION OF THE PREFERRED EMBODIMENTS

Embodiments of the present invention will hereafter be described with reference to the accompanying drawings.

Figure 1A:
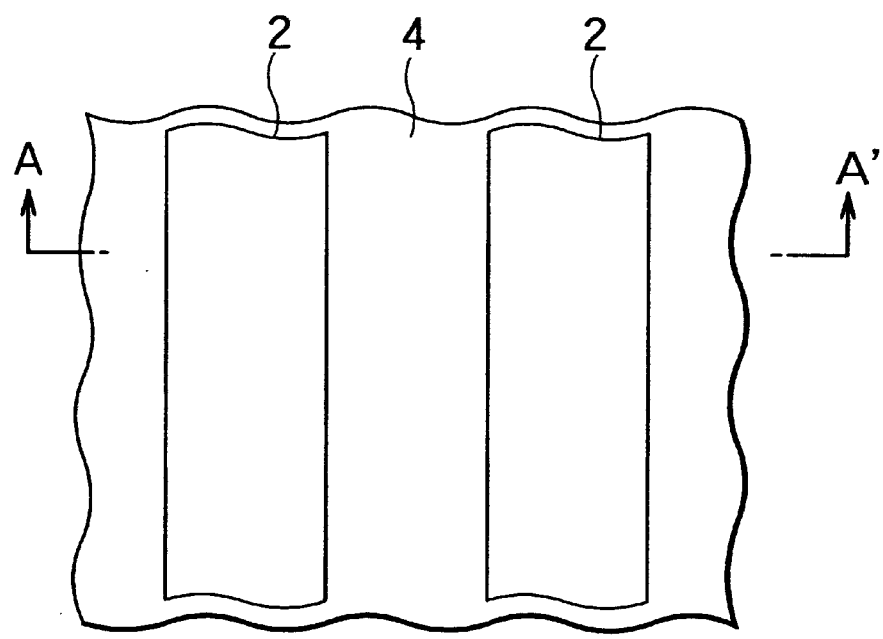
FIGS. 1A and 1B are explanatory views showing an element isolation technique of a prior art NAND type EERPOM memory cell array.
Figure 1B:
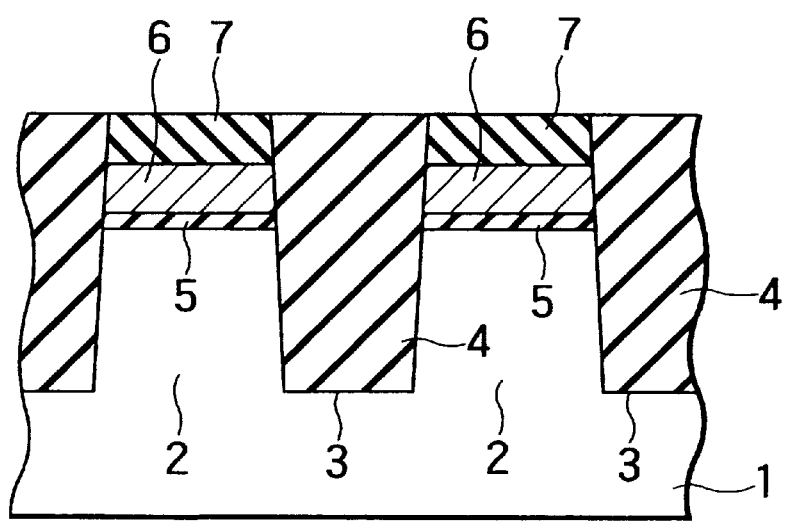
Figure 2A:
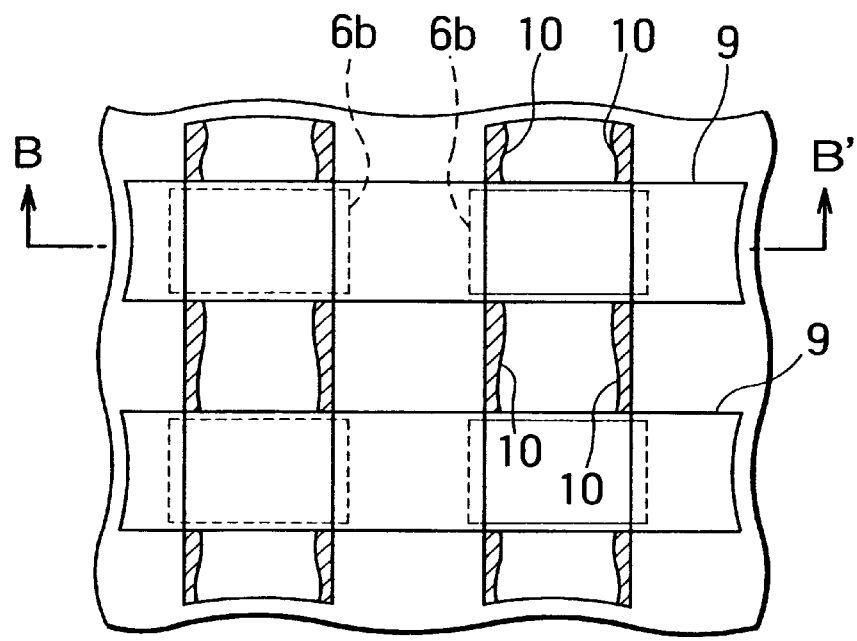
FIGS. 2A and 2B are explanatory views showing the same conventional element isolation technique and its problem.
Figure 2B:
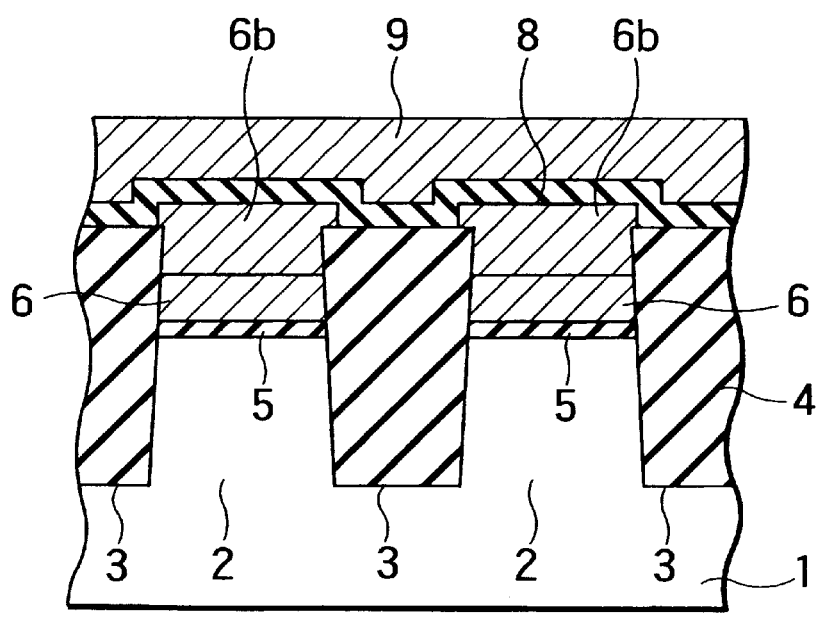
Figure 3:
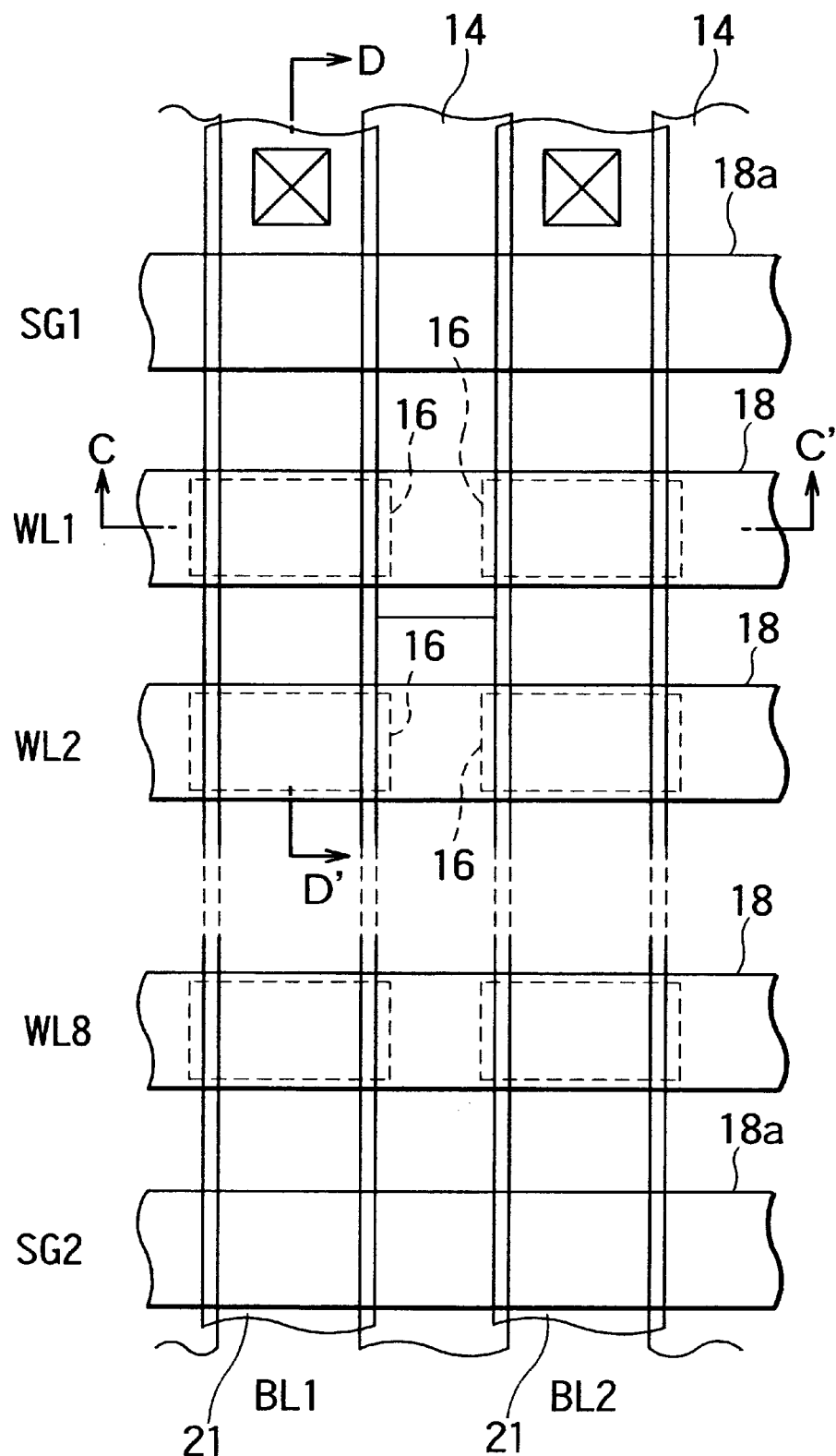
FIG. 3 is a plan view showing a memory cell array of the NAND type EEPROM in one embodiment of the present invention.
Figure 4A:
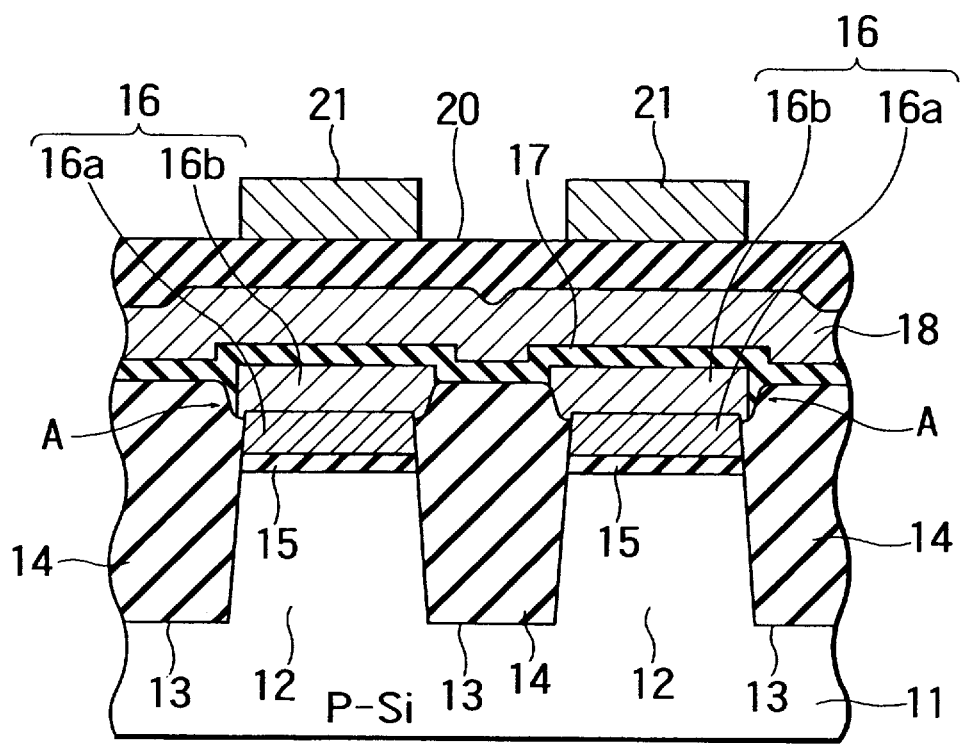
FIG. 4A is a sectional view taken along the line C–C' in FIG. 3.
Figure 4B:
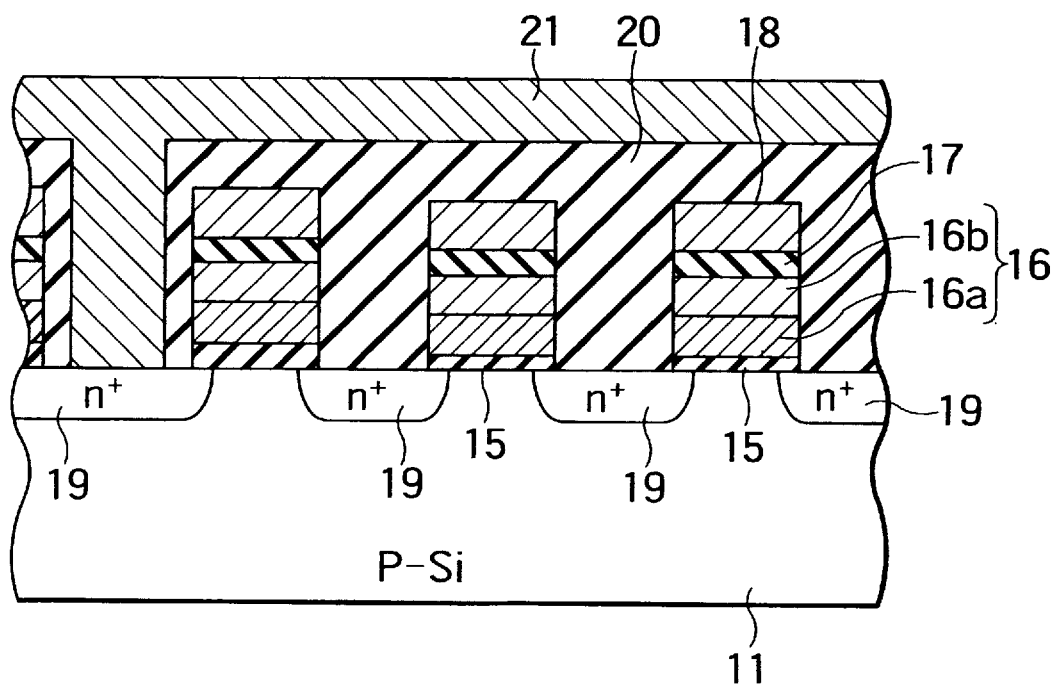
FIG. 4B is a sectional view taken along the line D–D' in FIG. 3.

FIG. 3 is a plan view illustrating a structure of a memory cell array in an embodiment in which the present invention is applied to a NAND type EEPROM. FIG. 4A is a sectional view taken along the line C—C in FIG. 3. FIG. 4B is a sectional view taken along the line D–D' in FIG. 3.

A trench 13 for isolating a device is formed in an element isolation region on a p-type silicon substrate 11 by an STI (Shallow Trench Isolation) technique, and an element isolation insulation film 14 is embedded in this trench 13. A device forming area 12 defined by the element isolation insulation film 14 takes a stripe shape, and is provided with a floating gate electrode 16 through a gate insulation film (a tunnel insulation film) 15. A control gate electrode 18 is further provided on the floating gate electrode 16 through an inter-layer gate insulation film 17.

In this embodiment, the floating gate electrode 16 is formed based on a stack structure of a first gate electrode 16a and a second gate electrode 16b. A depositing process of the first gate electrode 16a of the floating gate electrode 16 is anterior to the embedding process of the element isolation insulation film 14. This point will be, however, described in details later on. The control gate electrode 18 is, as shown in FIG. 4A, consecutively formed in a pattern as a word line WL (WL1–WL8). A selective gate electrode 18a is formed by use of the same material layer as that of the control gate electrode 18 simultaneously with the formation of this electrode 18. This selective gate electrode 18a is subjected to patterning as a selective gate line SG (SG1 and SG2) in parallel to the word line WL.

The floating gate electrode 16 is self-aligned with the control gate electrode 18 and the selective gate electrode 18a as well, and isolated per memory transistor within a NAND type cell. Ions are implanted with the control gate electrode 18 and the selective gate electrode 18a serving as a mask, thereby providing a source/drain diffused layer 19 of each memory transistor of the NAND type cell.

An inter-layer insulation film 20 is provided on the selective gate electrode 18a as well as on the control gate electrode 18, a bit line (BL) 21 connected to one terminal of the NAND cell is formed in a pattern thereon in a direction orthogonal to the word line WL.

Note that the control gate electrode 18 and the selective gate electrode 18a are illustrated in FIG. 4B as having substantially the same structure, however, the gate insulation film just under the selective gate electrode 18a is formed thicker than the memory transistor area. Further, the selective gate electrode 18a is connected to the second gate electrode 16b of the floating gate electrode 16 which is consecutively formed in pattern without being isolated in the direction of the word line, in a proper position excluding a sectional position in FIG. 4B.

In this embodiment, as shown in the section in FIG. 4A, an upper edge corner A of the element isolation insulation film 14 is recessed by isotropic etching, and terminates at a side surface of the first gate electrode 16a of the floating gate electrode 16.

That is, a position of the surface coming into contact with the floating gate electrode 16 at the corner A is lower than an upper surface of the first gate electrode 16a but higher than an interface with the gate insulation film 15. Further, in an area disposed away from the corner A, the surface position of the element isolation insulation film 14 is higher than that of the first gate electrode 16a.

Next, a process of manufacturing the NAND type memory array described above, will be specifically explained. FIGS. 5A–5H show the manufacturing process thereof of the section in FIG. 4A.

Figure 5A:
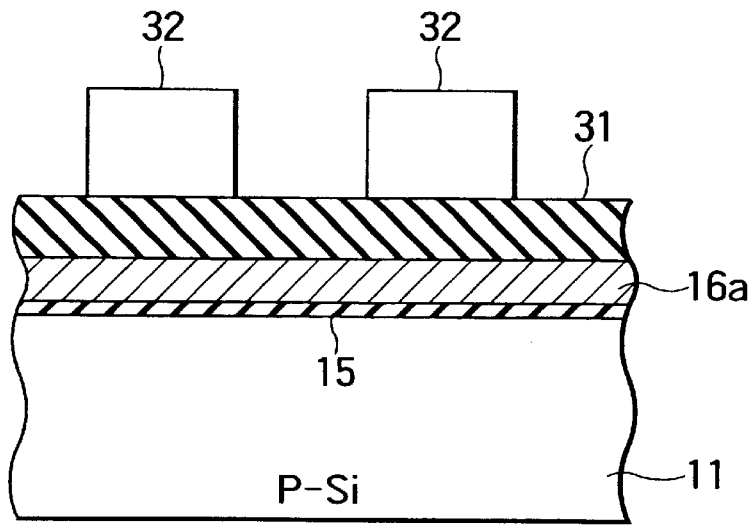
FIGS. 5A–5H are views showing a manufacturing process thereof of the section in FIG. 4A.

As shown in FIG. 5A, a gate insulation film 15 is formed on a silicon substrate 11, and a first gate electrode 16a which will serve as a floating gate electrode is deposited on the gate insulation film 15. Then a silicon nitride layer 31 serving as a stopper mask material when in a CMP process of the element isolation insulation film, is further deposited on the first gate electrode 16a. In this embodiment, the gate insulation film 15 is defined as a tunnel oxide layer formed by thermal oxidation. Furthermore, the gate electrode 16a is an amorphous silicon layer or a polycrystalline silicon layer.

Figure 5B:
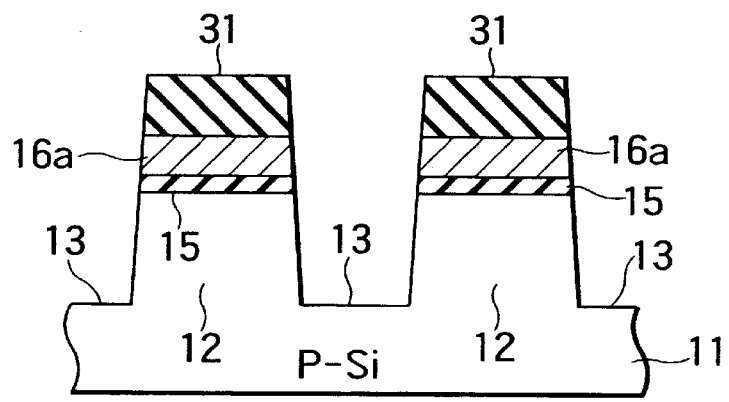

A resist pattern 32, of which an opening is formed in the element isolation region, is provided on the silicon nitride layer 31 by lithographic technique. Then, the silicon nitride layer 31, the gate electrode 16a and the gate insulation film 15 are etched by RIE (Reactive Ion Etching) classified as anisotropic dry etching, with the resist pattern 32 serving as a mask, and further the substrate 11 is etched, thereby forming a shallow trench 13 for the element isolation as illustrated in FIG. 5B.

The gate electrode 16a is also processed in the same pattern as the device forming area 12 but is not yet isolated per memory transistor in the NAND cell at this stage.

Figure 5C:
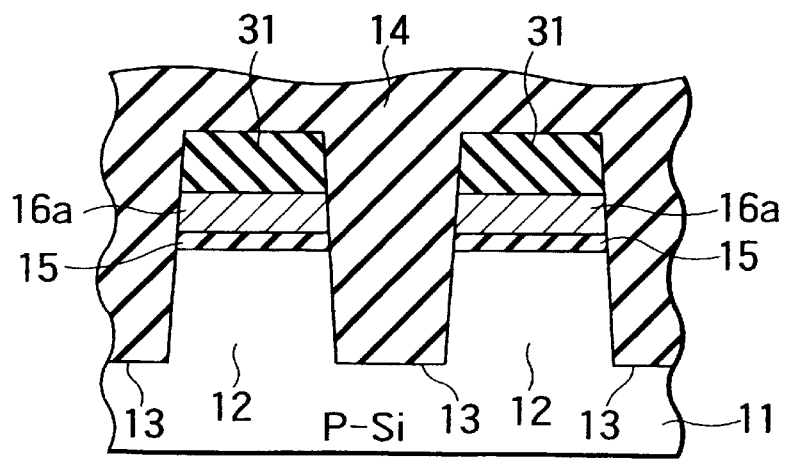
Figure 5D:
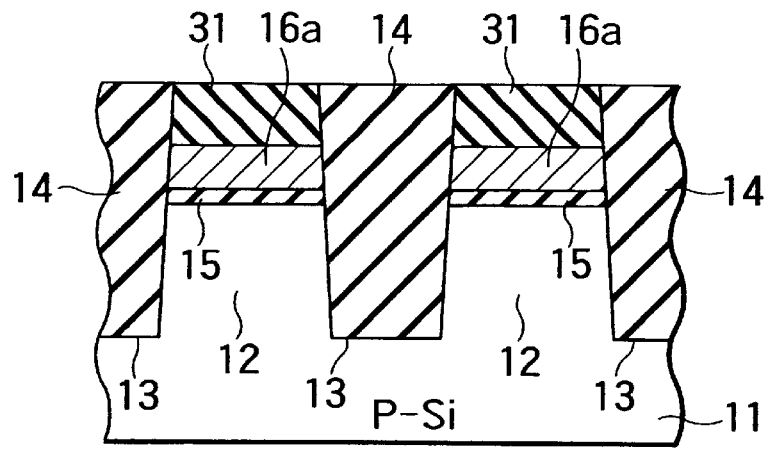

After removing the resist pattern 32, as shown in FIG. 5C, the silicon oxide layer 14 which will turn out to be the element isolation insulation film is deposited by a CVD (Chemical Vapor Deposition) method. Subsequently, the silicon oxide layer 14 is polished by the CMP process with the silicon nitride layer 31 being used as the stopper mask with the result that the silicon nitride layer 31 is exposed as shown in FIG. 5D, and the silicon oxide layer 14 is filled (embedded) in the element isolation trench 13, thereby obtaining a flattened state.

Figure 5E:
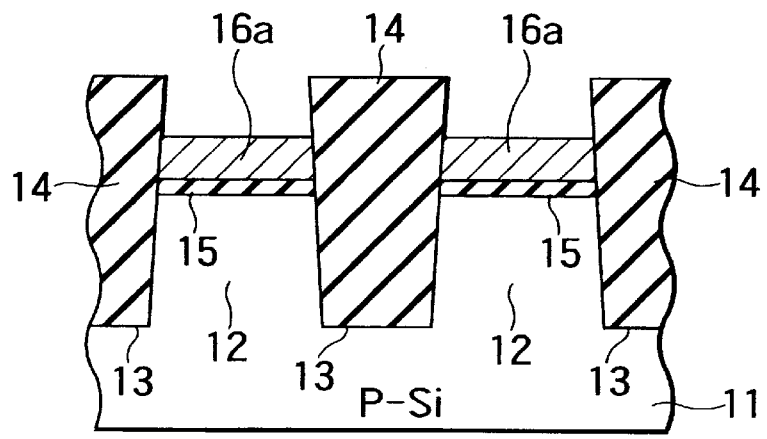

Thereafter, as illustrated in FIG. 5E, the silicon nitride layer 31 is removed by etching. At this time, the element isolation insulation film 14 takes an inverted tapered shape as shown in FIG. 5E, and comes into a state of protruding from the surface position of the gate electrode 16a.

Figure 5F:
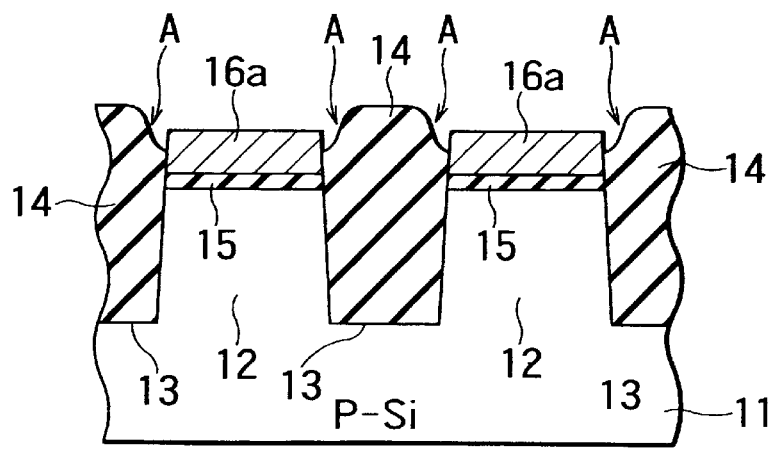

Next, the element isolation insulation film 14 is etched by the isotropic etching method, e.g., a wet etching method having a large selection ratio with respect to the gate electrode 16a, whereby the upper edge corner A of the element isolation insulation film 14 is recessed as shown in FIG. 5F. At this time, an etching quantity is selected so that the gate insulation film 15 is not exposed at the corner A. With this process, there comes to such a state that the upper edge corner A of the element isolation insulation film 14 terminates at the side surface of the gate electrode 16a.

Figure 5G:
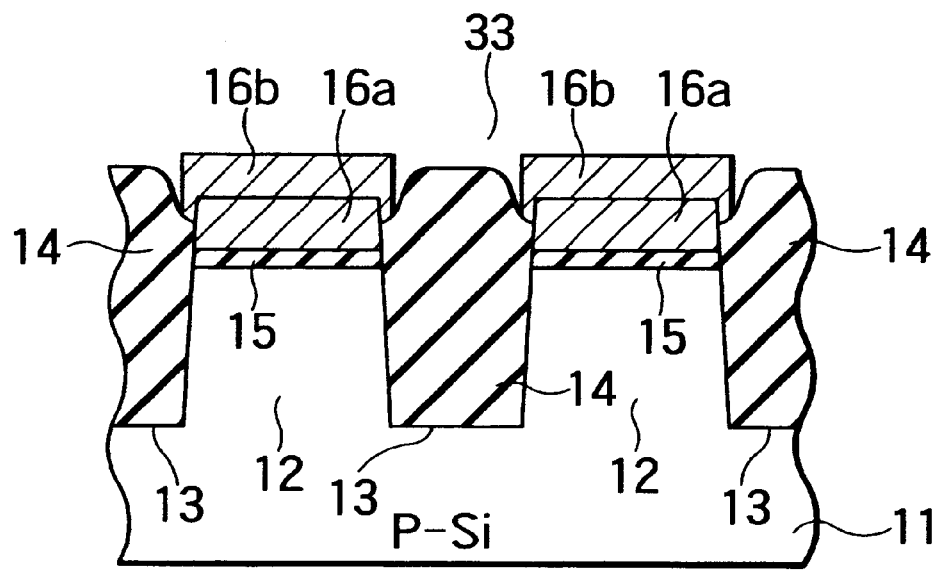
Figure 5H:
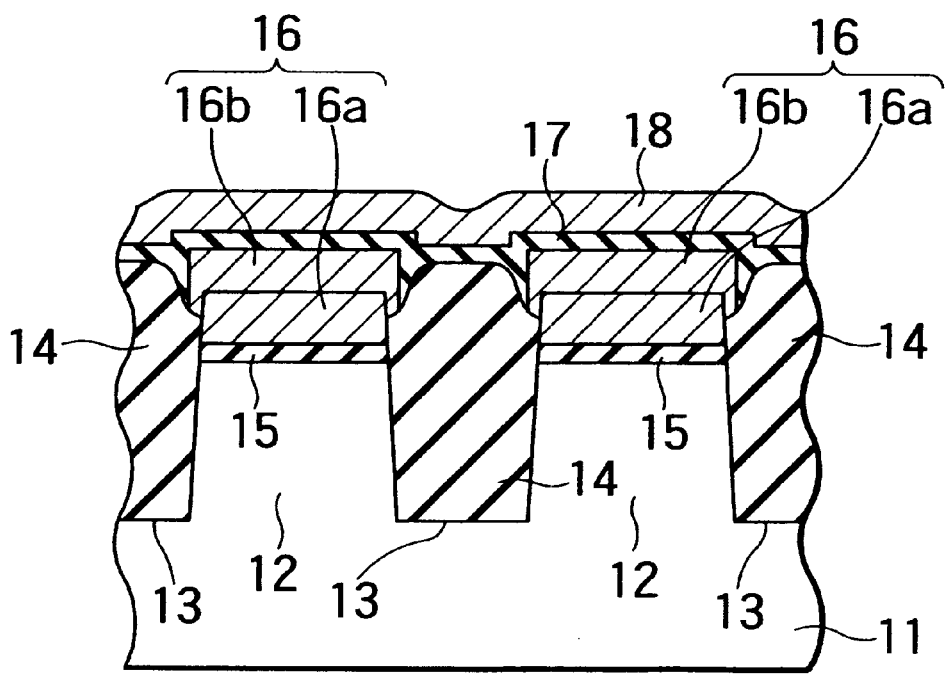

More specifically, the position of the surface, contacting the floating gate electrode 16a, of the corner A is lower than the upper surface of the floating gate electrode 16a but higher than the interface with the gate insulation film 15. Further, in the area disposed away from the corner A, the surface position of the element isolation insulation film 14 is higher than that of the floating gate electrode 16a. The isotropic etching may involve the use of, in addition to the wet etching, isotropic dry etching such as plasma etching etc, Thereafter, as illustrated in FIG. 5G, the second gate electrode 16b is deposited. A slit 33 for isolation is formed in an element isolation region of the second gate electrode 16b in order to be isolated in the direction of the word line. Then, as shown in FIG. 5H, an inter-layer gate insulation film 17 such as an ONO layer etc is formed, and the control gate electrode 18 is provided on this layer 17. The control gate electrode 18 is, as shown in FIGS. 3 and 4A, 4B, subjected to patterning as a consecutive word line in a direction orthogonal to the striped device area 12. Simultaneously with the control gate electrode 18, the second gate electrode 16b and the first gate electrode 16a, which are disposed under the electrode 18, are subjected to patterning, whereby the floating gate electrode 16 of each memory transistor is isolated in the form of being self-aligned with the word line.

Thereafter, the inter-layer insulation film 20 is, as illustrated in FIGS. 4A and 4B, deposited based on the normal process, and the bit line 21 is provided thereon.

In accordance with this embodiment, the element isolation insulating layer 14 is embedded in the inverted tapered shape in such a state as to protrude from the surface position of the gate electrode 16a, however, a rounding process of the upper edge corner A is executed. Therefore, in the etching process of patterning the control gate electrode 18 and the floating gate electrode 16, with the element isolation insulation film 14 serving as a mask, the floating gate electrodes 16a, 16b, especially the first gate electrode 16a formed before depositing the element isolation insulation film, is never left along the boundary of the element isolation insulation film 14. Accordingly, there is certainly prevented such an accident that a short-circuit occurs between the floating gate electrodes 16 of the adjacent memory transistors in the NAND cell.

Furthermore, since the upper floating gate has a larger area than the lower floating gate, the bit lines can be made flatter than conventional structure, thus the yield of devices increases.

Figure 6A:
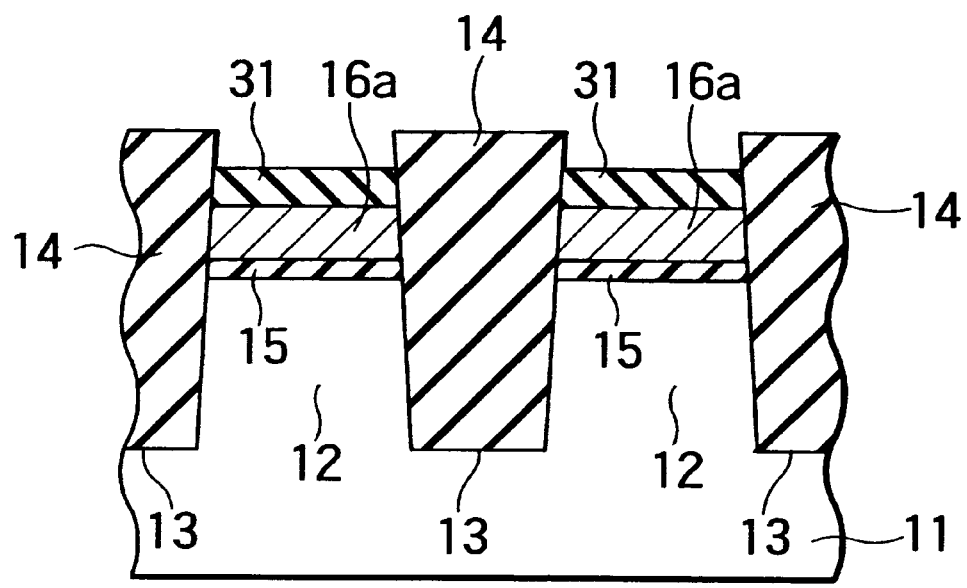
FIGS. 6A and 6B are views showing a manufacturing process in another embodiment of the present invention; .
Figure 6B:
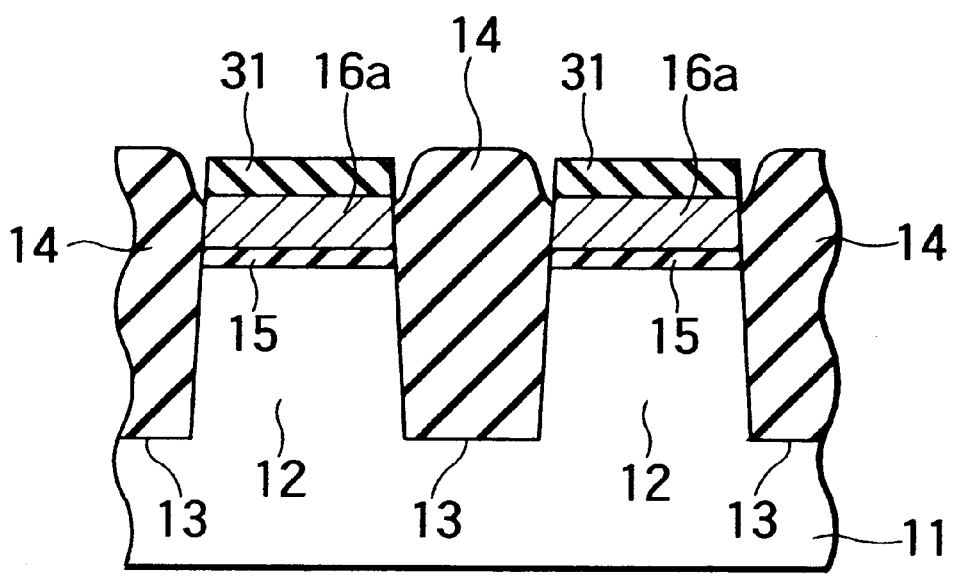

FIGS. 6A and 6B show a manufacturing process in another embodiment of the present invention. In the embodiment discussed above, as shown in FIG. 5E, after completely removing the silicon nitride layer 31, a recessing process of the corner of the element isolation insulation film 14 is executed. By contrast, according to this embodiment, after the process of embedding the element isolation insulation film 14 as shown in FIG. 5D in the preceding embodiment, a part of the silicon nitride layer 31 is etched as shown in FIG. 6A. In this state, the isotropic etching is. effected on the element isolation insulation film 14, whereby the corner A is recessed as shown in FIG. 6B. Hereinafter, the remaining silicon nitride layer 31 is removed, and the same processes as those in the previous embodiment are carried out.

In accordance with this embodiment, it is feasible to surely prevent such a situation that a terminating portion of the corner A reaches the gate insulation film 15 and the gate insulation film 15 is to be etched due to over-etching from the side surface in the isotropic etching for recessing the corner A of the element isolation insulation film 14.

In the embodiment discussed above, the floating gate electrode is constructed of a double-layered structure consisting of the first gate electrode 16a deposited before the process of embedding the element isolation insulation film 14 and of the second gate electrode 16b laminated after embedding the element isolation insulation film 14. This structure is intended to increase a coupling capacity by letting even the side surface of the floating gate electrode 16 face the control gate electrode 18. The present invention is, however, effective in a case where the floating gate electrode is constructed of only the first gate electrode 16a without using the second gate electrode.

The present invention is not limited to the NAND type EEPROM but is applicable to other non-volatile memories and MOS transistor circuits to which the same element isolation technique is applied.

Figure 7:
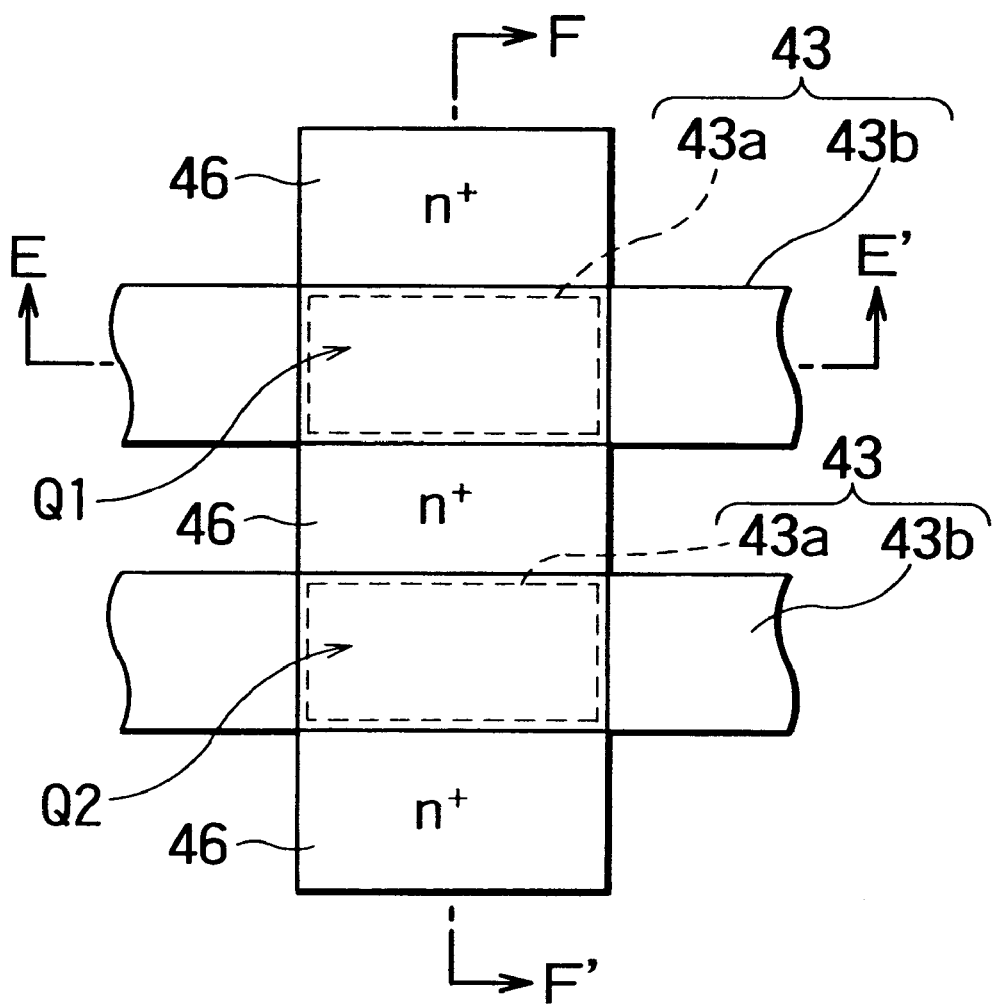
FIG. 7 is a plan view showing an embodiment of being applied to a normal MOS transistor circuit.
Figure 8A:
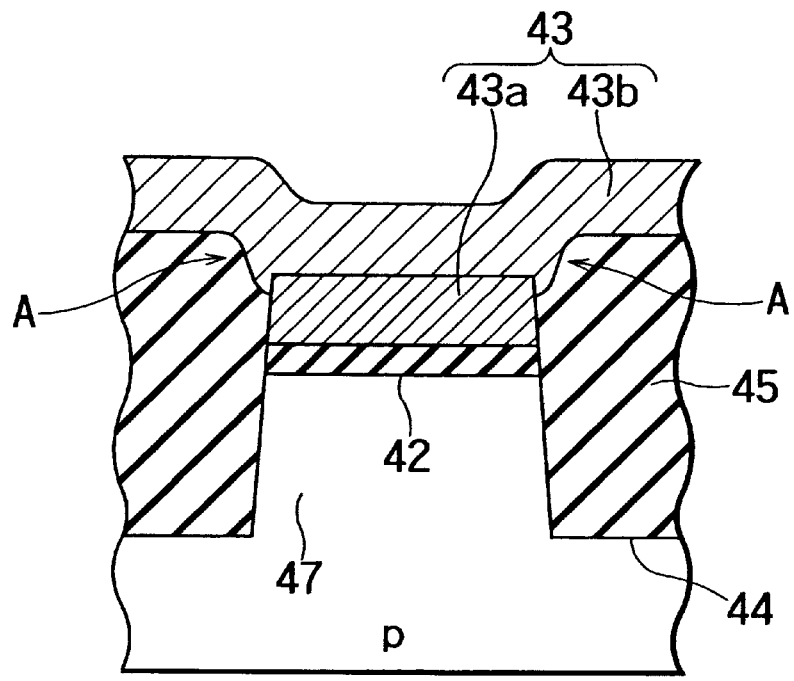
FIGS. 8A and 8B are sectional views taken along the lines A–A' and B–B' in FIG. 7.
Figure 8B:
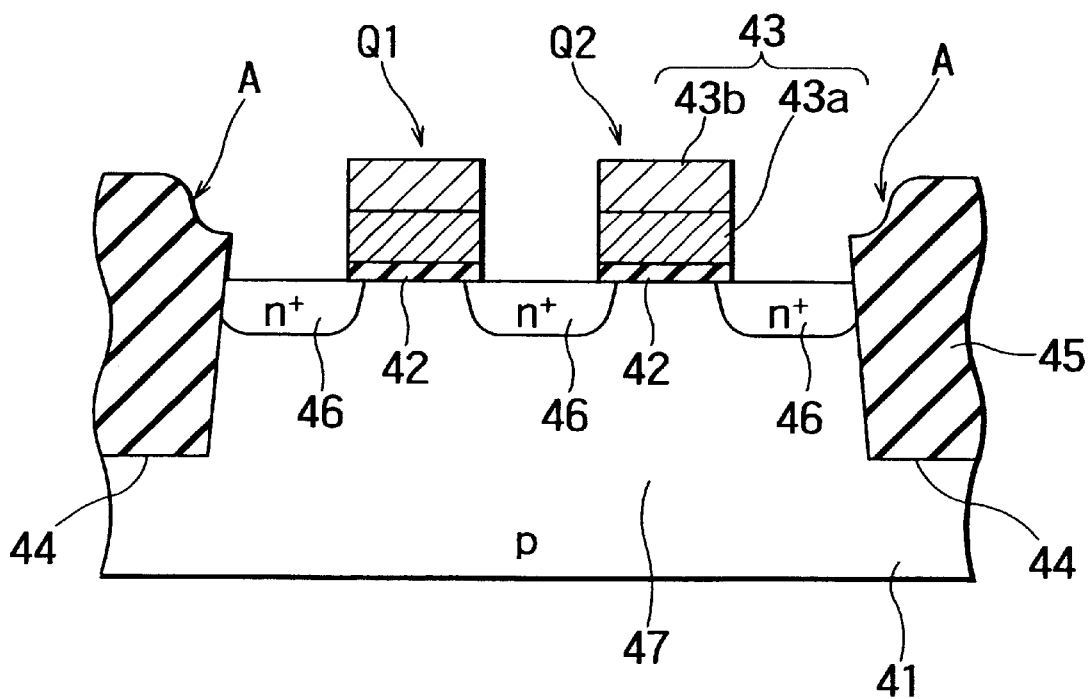

To be specific, FIG. 7 is a plan view showing an embodiment being applied to a normal MOS transistor circuit. FIGS. 8A and 8B are sectional views taken along the lines E–E' and F–F' in FIG. 7. This embodiment exemplifies how two MOS transistors Q1, Q2 are provided sharing one single diffused layer within one single device area 47 of the silicon substrate 41.

A first gate electrode 43a and an unillustrated stopper mask layer are deposited through a gate insulation film 42 on the silicon substrate 41 before isolating the device in the same way as the preceding embodiment. Then, the mask layer and the first gate electrode 43a are etched by the RIE so that the device areas are left, and further the substrate 41 is etched, thereby forming a trench 44 which defines a device area 47. An element isolation insulation film 45 is embedded in the trench 44 also in the same way as the preceding embodiment. Thereafter, the mask layer is removed, and the upper edge corner A of the element isolation insulation film 45 is recessed by the isotropic etching.

Then, a second gate electrode 43b is deposited and subjected to patterning together with the first gate electrode 43a disposed thereunder, thereby providing a gate electrode line 43. Thereafter, the ions are implanted, thus providing a source/drain diffused layer 46.

In this embodiment also, the process of recessing the upper edge corner of the element isolation insulation film 45 by the isotropic etching, thereby surely preventing the situation in which the first gate electrode 43a is left along the boundary of the element isolation region without being etched when effecting the patterning on the gate electrode 43 within the device area.

As discussed above, the semiconductor device according to the present invention is structured such that the gate electrode of the transistor is deposited before the process of embedding the element isolation insulation film, and the element isolation insulation film is embedded in the state of its protruding from the surface of the semiconductor substrate. In the thus structured semiconductor device, the upper edge corner of the element isolation insulation film is recessed before the patterning process of the gate electrode, thereby preventing such a situation that a part of the gate electrode remains unetched in the patterning process of the gate electrode. With this contrivance, there is obtained the semiconductor device exhibiting a high reliability with no defect such as a short-circuit of the gate electrode.

FIGS. 9A–9I are sectional views illustrating the process for manufacturing a semiconductor device.

FIGS. 9A–9F correspond to FIG. 5A–5F of the first embodiment, respectively.

Figure 9A:
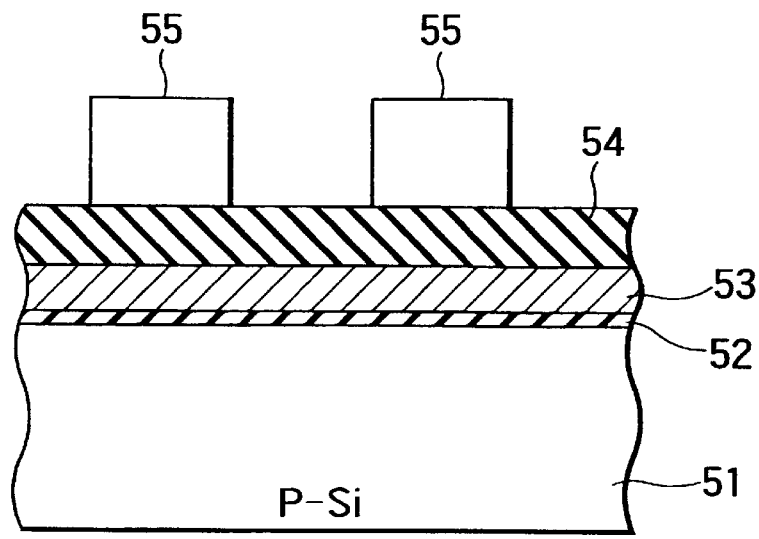
FIGS. 9A–9I are sectional views showing a manufacturing process according to another embodiment of the present invention.

As shown in FIG. 9A, a gate insulation film 52 is formed on a silicon substrate 51, and a first gate electrode 53 which will serve as a floating gate electrode is deposited on the gate insulation film 52. Then a silicon nitride layer 54 serving as a stopper mask material when in a CMP process of the element isolation insulation film, is further deposited on the first gate electrode 53.

Figure 9B:
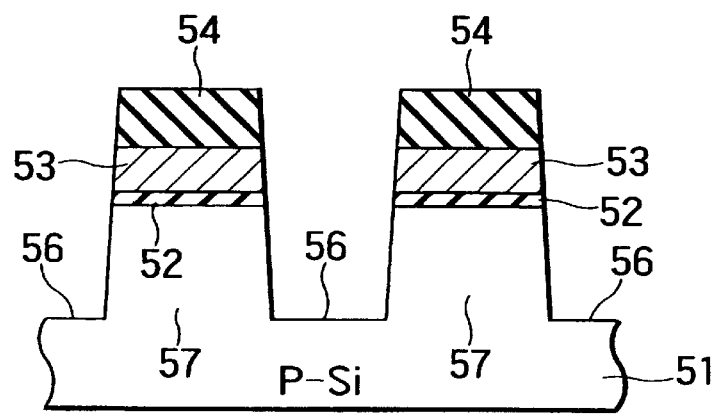

A resist pattern 55, of which an opening is formed in the element isolation region, is provided on the silicon nitride layer 54 by a lithographic technique. Then, the silicon nitride layer 54, the gate electrode 53 and the gate insulation film 52 are etched by RIE (Reactive Ion Etching), with the resist pattern 55 serving as a mask, and further the substrate 11 is etched, thereby forming a shallow trench 56 for the element isolation as illustrated in FIG. 9B.

The gate electrode 53 is also processed in the same pattern as the device forming area 57 but is not yet isolated per memory transistor in the NAND cell at this stage.

Figure 9C:
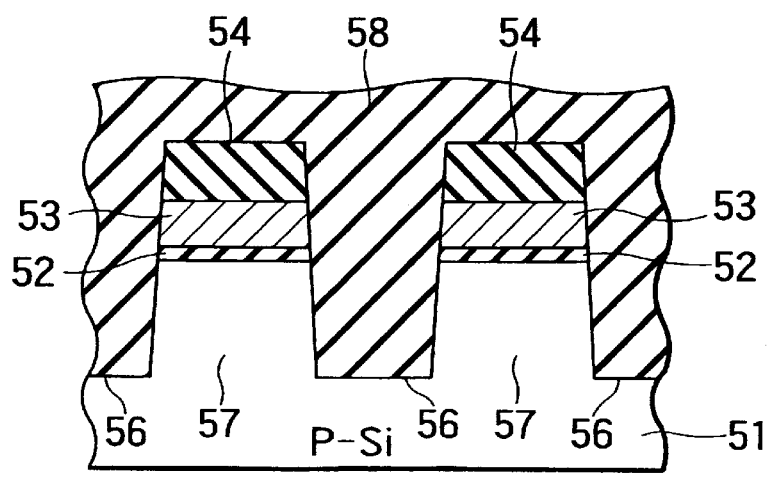
Figure 9D:
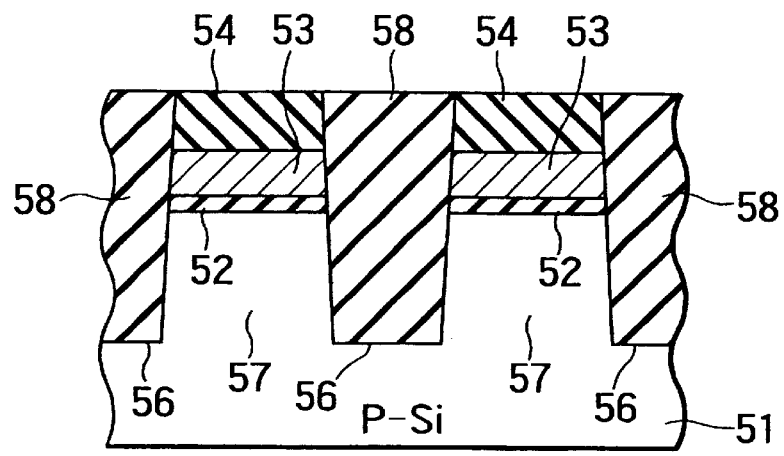

After removing the resist pattern 55, as shown in FIG. 9C, the silicon oxide layer 58 which will turn out to be the element isolation insulation film is deposited by a CVD (Chemical Vapor Deposition) method. Subsequently, the silicon oxide layer 58 is polished by the CMP process with the silicon nitride layer 54 being used as the stopper mask with the result that the silicon nitride layer 54 is exposed as shown in FIG. 9D, and the silicon oxide layer 58 is filled (embedded) in the element isolation trench 56, thereby obtaining a flattened state.

Figure 9E:
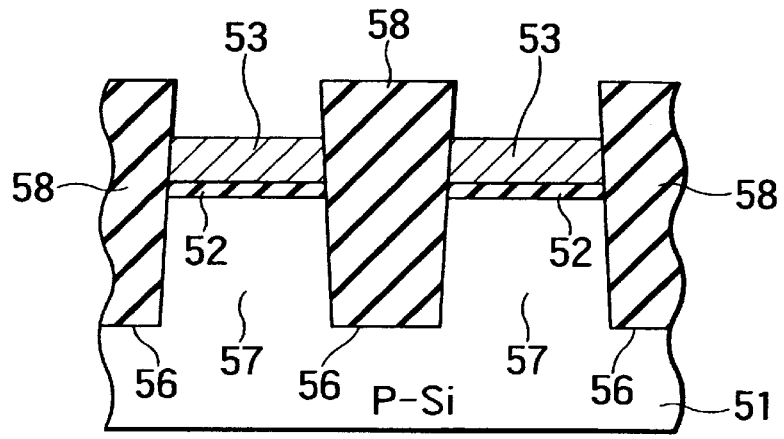

Thereafter, as illustrated in FIG. 9E, the silicon nitride layer 54 is removed by etching. At this time, the element isolation insulation film 58 takes an inverted tapered shape as shown in FIG. 9F, and comes into a state of protruding from the surface position of the gate electrode 53.

Figure 9F:
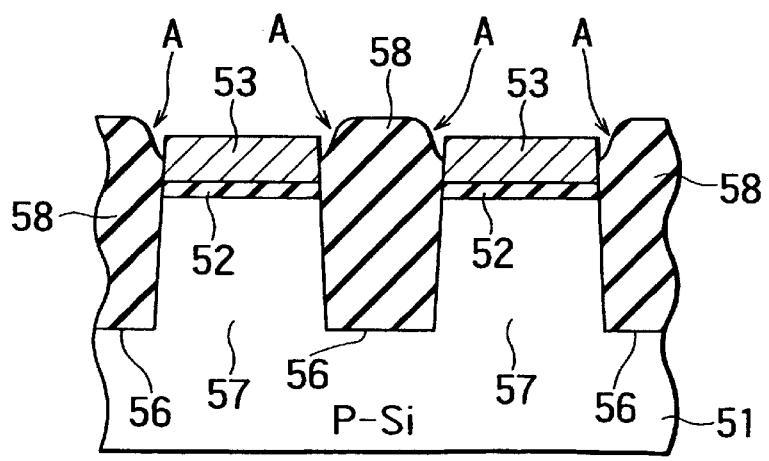

Next, the element isolation insulation film 58 is etched by the isotropic etching method, e.g., a wet etching method having a large selection ratio with respect to the gate electrode 53, whereby the upper edge corner A of the element isolation insulation film 58 is recessed as shown in FIG. 9F. At this time, an etching quantity is selected so that the gate insulation film 52 is not exposed at the corner A. With this process, there comes to such a state that the upper edge corner A of the element isolation insulation film 58 terminates at the side surface of the gate electrode 53.

More specifically, the position of the surface, contacting the floating gate electrode 53, of the corner A is lower than the upper surface of the floating gate electrode 53 but higher than the interface with the gate insulation film 52. Further, in the area disposed away from the corner A, the surface position of the element isolation insulation film 14 is higher than that of the floating gate electrode 53.

Figure 9G:
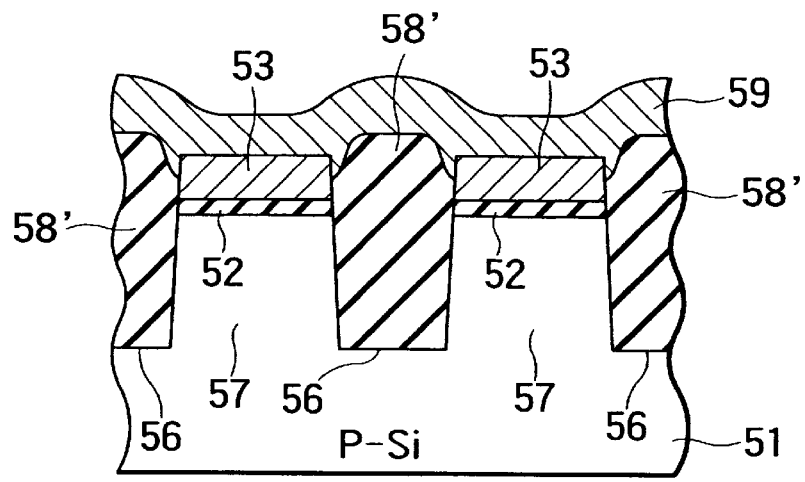
Figure 9H:
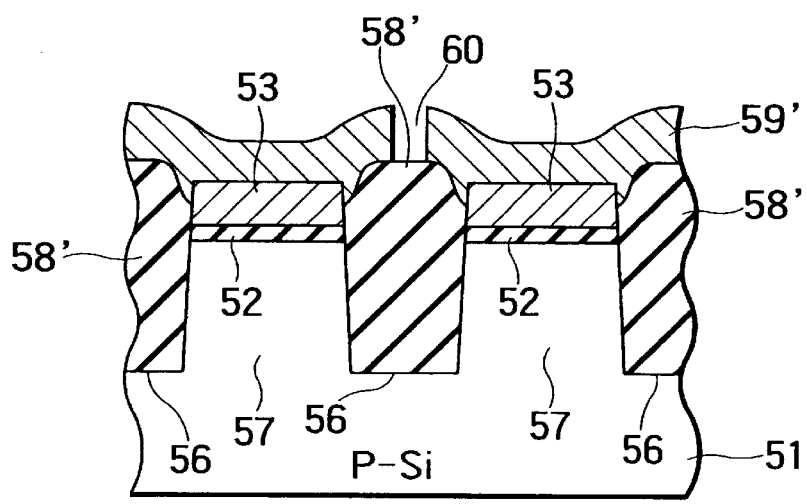

Thereafter, as illustrated in FIG. 9G, the second gate electrode 59 is deposited. A slit 60 for isolation of the second gate electrode 59 is formed on the element isolation insulation film 58' in order to be isolated in the direction of the word line as shown in FIG. 9H. More specifically, the slit 60 is located at the center part of the element isolation insulation film 58' and the end part of the second gate electrode 59' is disposed on the element isolation insulation film 58'.

Figure 9I:
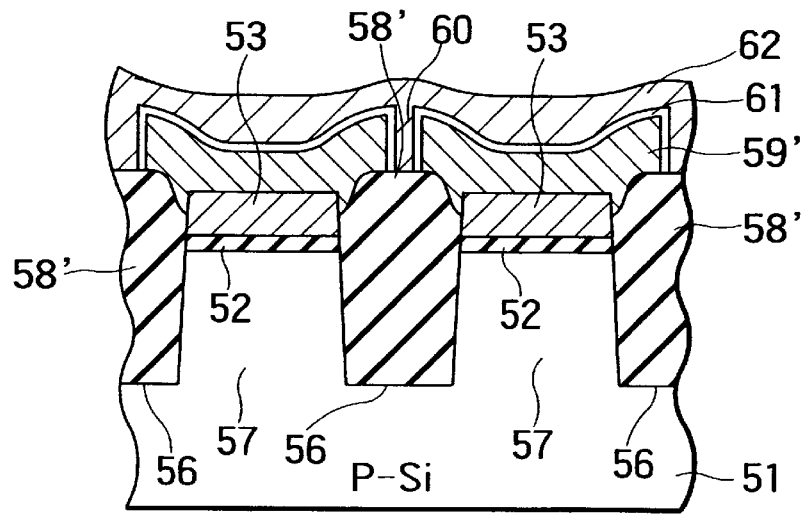

Then, as shown in FIG. 9I, an inter-layer gate insulation film 61 such as an ONO layer etc is formed on the whole surface of the patterned gate electrode 59', and the control gate electrode 62 is provided on this layer 61. The control gate electrode 62 has the same structure as that of the control gate 18 shown in FIGS. 3 and 4A, 4B.

Simultaneously with the control gate electrode 62, the gate electrode 53 is subjected to patterning, whereby the floating gate electrode 53 and 59' of each memory transistor is isolated in the form of being self-aligned with the word line.

Thereafter, the inter-layer insulation film 20 is, as illustrated in FIGS. 4A and 4B, deposited based on the normal process, and the bit line 21 is provided thereon.

In accordance with this embodiment, since the second gate electrode 59' has a larger area compared to the second gate electrode 16b of the first embodiment, the coupling ratio of the floating gate is increased whereby an enhanced writing characteristic can be obtained.

What is claimed is:

1. A semiconductor device comprising:

a semiconductor substrate;

an element isolation insulation film embedded in a trench formed in said semiconductor substrate in a state of protruding from a surface of said semiconductor substrate; and a transistor provided on said semiconductor substrate having a floating gate electrode, wherein said element isolation insulation film embedded in the trench has a recessed portion at an upper edge corner thereof, and wherein a lower end of the recessed portion is disposed on a side of the floating gate electrode.

2. The semiconductor device according to claim 1, wherein said element isolation insulation film has an inverted taper and said recessed portion has an ordinary taper.

3. A semiconductor device comprising:

a semiconductor substrate;

an element isolation insulation film embedded in a trench formed in said semiconductor substrate in a state of protruding from a surface of said semiconductor substrate; and a transistor provided on said semiconductor substrate, said transistor having a floating gate electrode formed on a gate insulation film, wherein an upper edge corner of said element isolation insulation film has a recessed portion, and wherein a lower end of the recessed portion is disposed on a side of the floating gate electrode.

4. The semiconductor device according to claim 3, wherein said transistor is a non-volatile memory transistor of which a control gate electrode is stacked on the floating gate electrode via an inter-layer insulator gate insulation film.

5. The semiconductor device according to claim 3, wherein a lower end of the recessed portion is disposed above the gate insulation film.

6. The semiconductor device according to claim 4, wherein said floating gate electrode is composed of a first layer and a second layer stacked on the first layer.

7. The semiconductor device according to claim 6, wherein a boundary of the first layer and the second layer is substantially located at a lower end of the recessed portion.

8. A semiconductor device comprising:

a semiconductor substrate;

an element isolation insulation film embedded in a trench formed in said semiconductor substrate in a state of protruding from a surface of said semiconductor substrate; and a transistor having a stacked structure in which a floating gate electrode is formed on a gate insulation film and a control gate electrode is formed on the floating gate electrode through an interlayer gate insulation film, wherein said element isolation insulation film embedded in the trench has a recessed portion at an upper edge corner thereof and wherein a lower end of the recessed portion is disposed on a side of the floating gate electrode.

9. The semiconductor device according to claim 8, wherein an upper surface of said element isolation insulation film is disposed over an upper surface of the floating gate electrode.

* * * * *

UNITED STATES PATENT AND TRADEMARK OFFICE
CERTIFICATE OF CORRECTION

PATENT NO. : 6,222,225 B1
DATED : April 24 2001
INVENTOR(S) : Takuya Nakamura et al.

It is certified that error appears in the above-identified patent and that said Letters Patent is hereby corrected as shown below:

Title page,
Item [54], Title:
"SEMICONDUCTOR DEVICE AND MANUFACTURING METHOD THEREOF" has been replaced with -- SEMICONDUCTOR DEVICE HAVING AN EMBEDDED ELEMENT ISOLATION INSULATION FILM --.

Signed and Sealed this

Twenty-fifth Day of December, 2001

Attest:

Attesting Officer

JAMES E. ROGAN
*Director of the United States Patent and Trademark Office*